(12) United States Patent
Glatfelter et al.

(10) Patent No.: US 6,468,828 B1
(45) Date of Patent: Oct. 22, 2002

(54) METHOD OF MANUFACTURING LIGHTWEIGHT, HIGH EFFICIENCY PHOTOVOLTAIC MODULE

(75) Inventors: Troy Glatfelter, Royal Oak; Subhendu Guha, Troy, both of MI (US)

(73) Assignee: Sky Solar L.L.C., Troy, MI (US)

( * ) Notice: Subject to any disclaimer, the term of this patent is extended or adjusted under 35 U.S.C. 154(b) by 118 days.

(21) Appl. No.: 09/591,133

(22) Filed: Jun. 9, 2000

Related U.S. Application Data

(62) Division of application No. 09/115,465, filed on Jul. 14, 1998, now abandoned.

(51) Int. Cl.[7] .................. H01L 31/042; H01L 31/18
(52) U.S. Cl. ................ 438/80; 438/85; 438/98; 438/66; 438/69; 136/249; 136/244; 136/251; 136/256; 257/436; 257/437; 257/443
(58) Field of Search ................ 438/85, 98, 80, 438/66, 69; 136/249, 244, 251, 256; 257/436, 437, 443

(56) References Cited

U.S. PATENT DOCUMENTS

| 4,243,432 A | * | 1/1981 | Jordan et al. | 136/244 |
|---|---|---|---|---|
| 4,316,049 A | | 2/1982 | Hanak | |
| 4,419,533 A | | 12/1983 | Czubatyj et al. | |
| 4,442,310 A | | 4/1984 | Carlson et al. | |
| 4,471,155 A | | 9/1984 | Mohr et al. | |
| 4,542,578 A | | 9/1985 | Yamano et al. | |
| 4,726,849 A | | 2/1988 | Murata et al. | |
| 4,783,421 A | | 11/1988 | Carlson et al. | |
| 4,954,181 A | | 9/1990 | Nishiura et al. | |
| 5,131,954 A | | 7/1992 | Vogeli et al. | |
| 5,133,809 A | | 7/1992 | Sichanugrist et al. | |
| 5,252,139 A | * | 10/1993 | Schmitt et al. | 136/251 |
| 5,268,037 A | * | 12/1993 | Glatfelter | 136/244 |
| 5,468,988 A | * | 11/1995 | Glatfelter et al. | 257/431 |
| 5,512,107 A | * | 4/1996 | van den Berg | 136/244 |
| 5,569,332 A | | 10/1996 | Glatfelter et al. | |
| 5,593,901 A | | 1/1997 | Oswald et al. | |
| 6,011,215 A | * | 1/2000 | Glatfelter et al. | 136/249 |

FOREIGN PATENT DOCUMENTS

EP          749161 A2  * 12/1996

* cited by examiner

Primary Examiner—Alan Diamond
(74) Attorney, Agent, or Firm—Gifford, Krass, Groh, Sprinkle, Anderson & Citkowski, P.C.

(57) ABSTRACT

A photovoltaic device includes a transparent, electrically conductive top electrode which functions as an anti-reflective layer. The thickness of this layer is selected to establish a three-quarter $\lambda$ anti-reflective condition. Use of this layer allows for the manufacture of a gridless photovoltaic device having an enhanced overall efficiency.

7 Claims, 5 Drawing Sheets

METHOD OF MANUFACTURING LIGHTWEIGHT, HIGH EFFICIENCY PHOTOVOLTAIC MODULE

This is a continuation of application Ser. No. 09/115,465 filed Jul. 14, 1998 now abandoned.

FIELD OF THE INVENTION

This invention relates generally to photovoltaic devices and to methods for their manufacture. More specifically, the invention relates to lightweight, high efficiency photovoltaic devices having a photovoltaically active area which is free of opaque current collecting grids.

BACKGROUND OF THE INVENTION

Photovoltaic devices provide a self-contained, reliable source of electrical power. Initially, photovoltaic devices were based on single crystal semiconductor materials; and consequently, they were expensive, fragile, restricted in size, and relatively heavy. Subsequently, techniques were developed for the preparation of large area, thin film semiconductor materials having very good electrical properties. These materials can be employed to fabricate photovoltaic devices which are light in weight, large in area, low in cost and of high efficiencies.

Because of these advantageous properties, thin film photovoltaic devices have found a number of uses, both in terrestrial and aerospace applications. A typical thin film photovoltaic device is fabricated upon a relatively lightweight substrate, and includes a body of photovoltaically active semiconductor material interposed between a top and a bottom electrode, and at least one of these electrodes is fabricated from a transparent, electrically conductive material. Most preferably, the photovoltaic devices are configured as modules of individual cells, supported on a common substrate, and connected in a series, parallel or mixed series parallel electrical relationship. In many applications, and in aerospace applications in particular, weight is at a premium, and thin film photovoltaic devices are attractive since they can deliver large amounts of power, on a weight basis, as compared to other sources of electrical energy.

A number of parameters can be optimized to maximize the power output of photovoltaic modules. The first involves the optimization of the photovoltaic material itself. Improvements in the quality and stability of photovoltaic alloys will improve the efficiency of devices fabricated therefrom. In addition, optimization of device configuration, such as for the use of stacked tandem, spectrum splitting cells, has further increases device efficiency. Another approach to increasing overall device efficiency involves lowering the resistive losses in the device. As noted above, photovoltaic devices require a transparent, electrically conductive electrode on their light incident side. These electrodes are generally fabricated from conductive metal oxides such as indium tin oxide and the like; and while they are electrically conductive, their conductivity is much lower than that of metals, and they can be significant sources of resistive loss. As a consequence, it is conventional in the art to include current collecting grid structures on the light incident surface of photovoltaic devices. These grids are fabricated from a high conductivity metallic material and serve to shorten the path of carriers through the transparent conductive electrode layer. U.S. Pat. No. 5,131,954 discloses a large-area photovoltaic array comprised of a plurality of interconnected devices, in which each device includes a current collecting grid.

While inclusion of grid lines does significantly decrease the resistance of a photovoltaic device, the grid lines are opaque and decrease the photovoltaically active area of a device. Current collecting grids can be eliminated if the dimensions of a photovoltaic device are kept quite small, typically such that current paths through the electrode are less than 0.25 cm; but then, current output of the device is very low, and if practical current levels are to be achieved, a large number of such small devices must be interconnected thereby giving rise to resistive losses and a decrease in active surface area of a module resultant from the many interconnections. As a consequence, in the design of photovoltaic modules, the dimensions of the current collecting grid, and hence resistive loss, is carefully balanced against loss of active area.

It is also known in the prior art that the overall conversion efficiency of a photovoltaic device can be increased by maximizing the amount of light absorbed by the photovoltaic device. This is accomplished by including back reflector structures in the device to redirect unabsorbed light back through photovoltaically active layers, and also by incorporating anti-reflective coatings on the light incident side of the photovoltaic device. As is known in the art, an anti-reflective condition can be established by including an anti-reflective layer in the photovoltaic device. The thickness and refractive index of the anti-reflective layer are selected so that an anti-reflective condition is established for wavelengths corresponding to the maximum illumination and/or maximum sensitivity of the photovoltaic device.

The anti-reflective layer may be separate from the transparent, conductive electrode; however, in many instances, the top, transparent conductive electrode layer itself is employed as an anti-reflective layer. In either case, the thickness of the $$T = \frac{\lambda}{4n}$$

anti-reflective layer is determined by the formula:

wherein T is the thickness of the anti-reflective layer, $\lambda$ is the wavelength being anti-reflected and n is the index of refraction of the anti-reflective layer. In those instances where the transparent conductive oxide materials are used as the top electrode and anti-reflective layer, n will be approximately 2. These layers are known in the art as one-quarter $\lambda$ anti-reflective layers, and have heretofore been preferred because they provide broad band anti-reflection. In most photovoltaic devices, the anti-reflective conditions are preferably established for wavelengths in the range of 450 to 600 nanometers, and accordingly, conventionally employed anti-reflective layers are usually in the thickness range of 60 to 75 nanometers. Reflection enhancing and suppressing layers for photovoltaic devices are shown in the prior art, for example in U.S. Pat. Nos. 5,569,332 and 4,419,533, and U.S. Pat. No. 4,471,155 specifically shows a photovoltaic device having a one-quarter $\lambda$ anti-reflection layer which is used in combination with a current collecting grid.

One aspect of the present invention resides in the recognition of the fact that thicker anti-reflective layers corresponding to a three-quarters $\lambda$ condition are actually preferable in photovoltaic devices. The thicker layers provide a narrower band anti-reflective condition than do quarter $\lambda$ layers, and their use appears to be contraindicated; however, the thicker layers have a significantly higher electrical conductivity, and when coupled with appropriate module design, allow for elimination of current collecting grids, thereby increasing the photovoltaically active area of the devices.

As will be described in greater detail hereinbelow, the present invention is directed to photovoltaic devices having enhanced efficiencies at preselected wavelengths, which devices are of gridless construction. The devices of the present invention are highly efficient, simple to fabricate and do not require current collecting grid structures which decrease active area of the device, necessitate additional processing steps, and can be sources of defects. These and other advantages of the present invention will be apparent from the drawings, discussion, description and examples which follows.

BRIEF DESCRIPTION OF THE INVENTION

There is disclosed herein a monolithic photovoltaic module which has an enhanced absorption of light at a preselected wavelength $\lambda$. The module is fabricated upon an electrically insulating substrate which has a plurality of photovoltaic devices disposed thereupon and electrically connected in series. Each photovoltaic device includes a bottom electrode supported on the substrate, a body of photovoltaic material disposed on the bottom electrode, and a transparent, electrically conductive top electrode disposed upon the body of photovoltaic material and separated from the bottom electrode thereby. In accord with the present invention, the thickness of the top electrode is given by the formula $$T = \frac{3\lambda}{4n}$$

wherein $\lambda$ is a wavelength of light in the range of 450–600 nm, and n is the index of refraction of the top electrode. The module further includes means for establishing a series electrical connection between members of the plurality of photovoltaic devices, and a first and a second terminal in electrical communication with a plurality of photovoltaic devices for withdrawing electrical power therefrom.

In particular embodiments, the top electrode has a thickness in the range of 170 to 225 nm. In certain embodiments, the electrical communication between the individual photovoltaic devices is established by high conductivity shunt paths established therethrough, and extending between the top electrode of a given photovoltaic device, and the bottom electrode of an adjoining device. In certain embodiments, the body of photovoltaic material comprises a plurality of layers of hydrogenated, group IV semiconductor alloy material configured as stacked, tandem, p-i-n type devices.

In accord with the present invention, there are also provided methods for fabricating the modules and devices thereof.

DETAILED DESCRIPTION OF THE INVENTION

The present invention is directed to a photovoltaic device, or a module made up of a plurality of photovoltaic devices, in which opaque, current carrying grid structures are eliminated, thereby increasing the photovoltaically active area of the devices. In accord with another feature of the present invention, photovoltaic devices are provided with an anti-reflective layer which enhances the absorption of light by the photovoltaic device, and this anti-reflective layer also functions as a top, transparent, electrically conductive electrode of the photovoltaic device. The thickness of the anti-reflective layer is selected so as to optimize both the anti-reflective properties of the layer as well as its current-carrying properties so as to thereby produce a photovoltaic device in which both the photovoltaically active area and absorbed light are simultaneously optimized.

Figure 1:
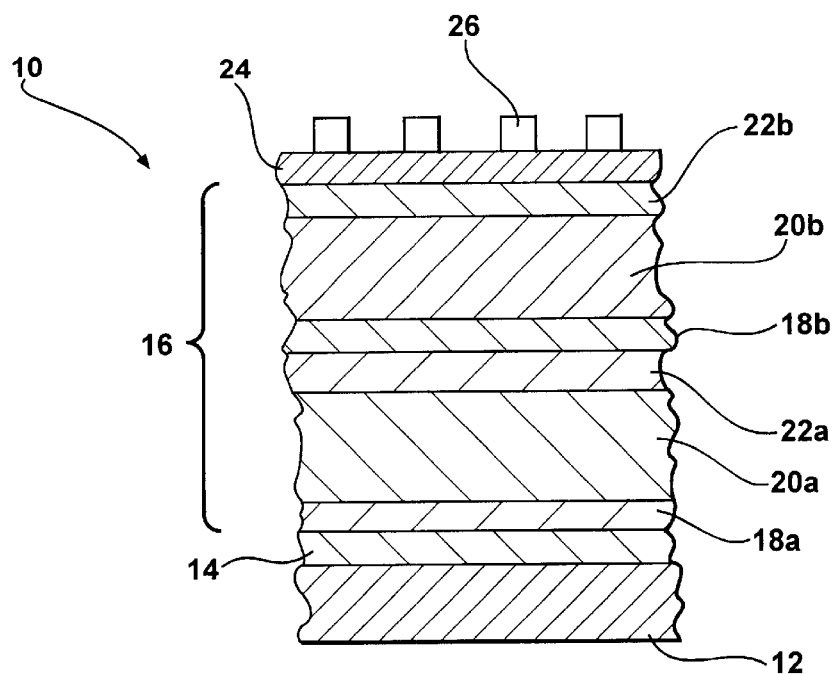
FIG. 1 is a cross-sectional view of a photovoltaic device of the prior art.
Figure 2:
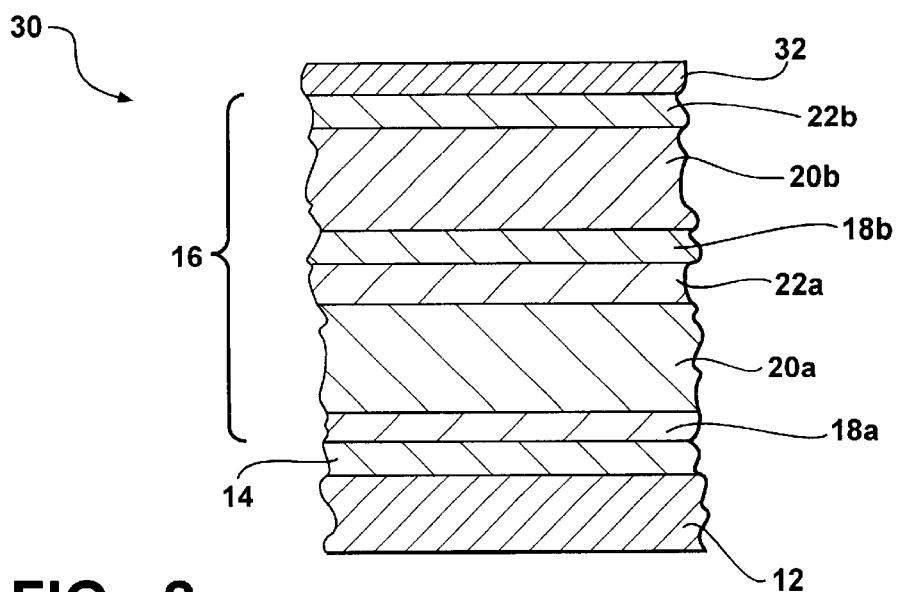
FIG. 2 is a cross-sectional view of a photovoltaic device structured in accord with the principles of the present invention.

The invention will be best understood by reference to the figures. FIG. 1 comprises a cross-sectional view of a photovoltaic device structured in accord with the prior art, and FIG. 2 is a cross-sectional view of a generally similar photovoltaic device embodying the present invention, and like structures in both devices will be referred to by like reference numerals.

The photovoltaic device 10 of FIG. 1 is fabricated on a substrate 12, which in this embodiment comprises an electrically insulating substrate such as a layer of polyimide material, which is typically in the range of 0.5–2 mils in thickness. Disposed upon the electrically insulating substrate 12 is a layer of bottom electrode material 14, which in this embodiment comprises a layer of a metal having a good electrical conductivity. Among some of the preferred metals are aluminum, copper, silver, nickel and the like. It is to be understood that the bottom electrode material 14 may be a multi-layered body, and may incorporate one or more layers of electrically conductive material therein, and may also include texturizing layers and the like, as is known in the art, for the purpose of enhancing reflection of light. It is also to be understood that in many instances, photovoltaic devices are fabricated directly onto electrically conducting substrates, which may comprise stainless steel and the like, with or without reflective and/or texturizing layers thereupon. In such instance, the substrate itself will also function as the back electrode. All of such variations may be employed in connection with the present invention.

Disposed upon the bottom electrode 14 is a body of photovoltaic material 16. In the context of the present disclosure, a body of photovoltaic material constitutes a body which, in response to the absorption of photons, generates electron-hole carrier pairs therein, and separates these pairs so as to produce a flow of photogenerated current which is collected by the top and bottom electrodes associated with the photovoltaic body. The principles of the present invention may be implemented in connection with variously configured photovoltaic bodies, including photovoltaic bodies comprised of crystalline material as well as disordered materials. In most instances, the photovoltaic body will comprise a plurality of variously doped layers of semiconductor material.

In the FIG. 1 device, the body of photovoltaic material 16 comprises a first and a second triad of semiconductor layers. The first triad is comprised of a body of n-doped semiconductor material 18a which is disposed upon the bottom electrode 14; a body of substantially intrinsic semiconductor material 20a which is disposed upon the layer of n-doped material 18a, and a layer of p-doped semiconductor material 22a which is disposed upon the body of intrinsic material 20a, and separated from the layer of n-doped material 18a thereby. These three layers 18a, 20a, 22a form a first triad which comprises a photovoltaic cell of p-i-n type configuration. The body of photovoltaic material 16 further includes a second triad comprised of a second layer of n-doped semiconductor material 18b, disposed upon the first layer of p-doped material 22a. The second triad further comprises a second intrinsic layer 20b, and a second p-doped layer 22b, disposed so as to form a second p-i-n photovoltaic device. As is known in the art, the photovoltaic body 16 depicted in FIG. 1 comprises a dual tandem photovoltaic device in which two p-i-n type devices are placed electrically, and optically in a series relationship. As is also known in the art, still further triads may be included to produce triple and quadruple devices. It is further to be understood that differently configured photovoltaic bodies, including schottky barrier devices, p-n devices and the like may be utilized in the practice of the present invention.

Disposed upon the top side of the photovoltaic body 16 is a layer of transparent, electrically conductive top electrode material 24. In the context of this disclosure, the top surface of a photovoltaic body and photovoltaic device will mean that side of the device or body which is disposed to receive incident light, and it is this surface which will include a transparent electrically conductive electrode. As is known in the art, transparent, electrically conductive electrode materials typically comprise oxides of indium, tin, zinc and other metals, taken either singly or in combination. In accord with prior art technology, the top electrode layer 24 of the FIG. 1 device 10 has a thickness of approximately 50 to 70 nm. This thickness is selected so as to provide an anti-reflective condition, and this anti-reflective condition is calculated utilizing the formula $$T = \frac{\lambda}{4n}$$

wherein $\lambda$ is the wavelength of light whose absorption is being enhanced, n is the index of refraction of the transparent conductive electrode material and T is the thickness required for the anti-reflective condition. Most transparent conductive oxide materials have an index of refraction of approximately 2, and accordingly T will typically have a value of approximately 50–70 mn. This is what is referred to as a conventional quarter $\lambda$ anti-reflective coating.

Since the electrical conductivity of transparent conductive electrode materials is relatively low, the device 10 of FIG. 1 includes a current collecting grid pattern 26 disposed upon the top electrode 24 thereof. This grid pattern 26 is formed from a relatively high conductivity metallic material such as a metallic paste, metallic wires, metallic foil or the like, and serves to provide a high conductivity collection path for photogenerated current. Inclusion of the grid structure 26 typically decreases the series resistance, and hence increases the efficiency, of the device 10. As discussed hereinabove, there is a drawback to utilizing grid structures, since the opaque grid structure 26 will effectively shield underlying portions of the device 10 from incident light; hence, device efficiency resultant from lowering the series resistivity by inclusion of the grid 26 must be balanced against loss of photogenerated current resultant from shading of photovoltaically active layers by the grid 26.

Referring now to FIG. 2, there is shown a photovoltaic device 30 structured in accord with the principles of the present invention. The device 30 of FIG. 2 is generally similar to the device 10 of FIG. 1, and like structures are referred to by like reference numerals. The device 30 of FIG. 2 is fabricated upon a substrate 12 and includes a bottom electrode 14 as previously described. The device further includes a photovoltaic body 16 which can also be similar to that of FIG. 1 and comprises two stacked triads of p-i-n layers. The device 30 of FIG. 2 also includes a top transparent electrode 32; however, the electrode 32 of the FIG. 2 device differs from the top electrode 22 of the FIG. 1 device insofar as the top electrode 32 of the FIG. 2 device is triple the thickness of the top electrode 22 of the FIG. 1 device. This electrode 32 also establishes an anti-reflective condition in accord with the formula $$T = \frac{3\lambda}{4n}$$

wherein n and $\lambda$ are as above. This is referred to as a three-quarter wavelength coating. Heretofore, conventional wisdom has held that one-quarter wavelength coatings are much more preferable in photovoltaic devices, because such coatings give a broader band anti-reflective condition; that is to say, absorption of light over a larger portion of the spectrum is enhanced by a quarter-wavelength coating, as compared to a three-quarter wavelength coating, which is known to produce a narrower anti-reflective range. As a result, a greater portion of incident light is absorbed by a photovoltaic device which has a quarter wavelength anti-reflective coating, than is absorbed by a similar device with a three-quarter $\lambda$ anti-reflective coating.

The present invention has broken with conventional wisdom, and recognizes that the loss in absorption resultant from the use of a three-quarter $\lambda$ coating is offset by the increase in conductivity of that coating, which increase is sufficient to permit the elimination of opaque current carrying grid structures. In accord with the present invention, it has been found that the loss in efficiency of a photovoltaic device resultant from the decreased light absorption caused by use of a three-quarter $\lambda$ coating is more than offset by increased net illumination of the active portions of the device resultant from elimination of opaque current collecting grid structures.

In the FIG. 2 device 30, the top electrode layer 32 has a thickness which is in the approximate range of 170 to 225 nm, and in the instance wherein this layer is fabricated from a transparent conductive oxide material such as indium tin oxide, it has been found that high efficiency collection of current can take place over collection lengths of more than 1 centimeter. This permits the fabrication of large area modules comprised of a plurality of smaller area devices which are connected in a series and/or parallel relationship. These small devices can be configured as series interconnected strips of approximately 1 centimeter in length, and a width of many hundreds of centimeters.

The principles of the present invention may be employed in connection with photovoltaic devices of various configurations, and with various methods for the fabrication of photovoltaic devices. All of such modifications and variations will be apparent to one of skill in the art. Presented herein are figures showing several methods for the fabrication of photovoltaic modules in accord with the present invention.

Referring now to FIGS. 3–7, there is shown the fabrication of one embodiment of module in accord with the present invention. The module of this embodiment comprises a plurality of series connected photovoltaic devices, and is fabricated upon an electrically insulating substrate, which in the most preferred embodiment, comprises a thin, light-weight substrate such as a polyimide substrate having a thickness in the range of 0.5–2 mils.

Figure 3:
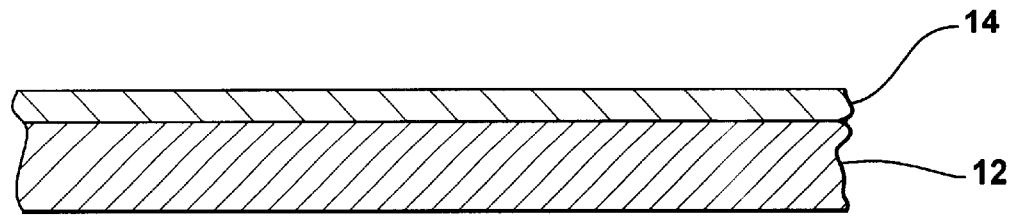
FIGS. 3–6 show the sequential steps in the fabrication of a photovoltaic module in accord with the present invention.

FIG. 3 shows one such electrically insulating substrate 12 having a body of bottom electrode material 14 disposed thereupon. This body of bottom electrode material 14 preferably comprises a metallic layer, and as noted above, may further include a texturizing layer, reflection enhancing layers and the like.

Figure 4:
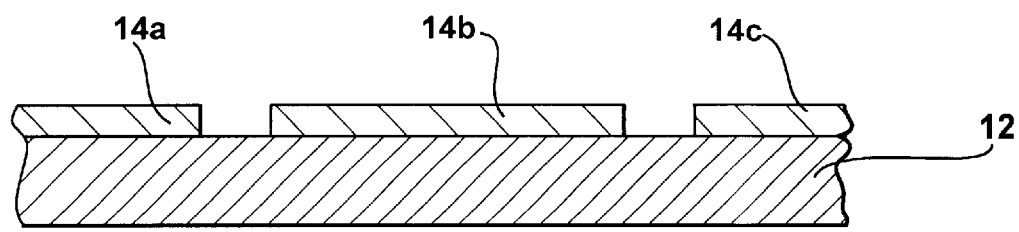

In the second step of the illustrated method, as is shown in FIG. 4, selected portions of the layer of bottom electrode material 14 are removed so as to define a plurality of spaced apart bottom electrodes 14a, 14b, 14c, which are electrically isolated from one another. The removal of the bottom electrode material 14 can be accomplished by use of a laser, or by methods including chemical etching, abrasive etching, water jet etching or the like. In some instances, the bottom electrode material 14 may be deposited onto the substrate 12 in a pre-established pattern by masking or the like.

Figure 5:
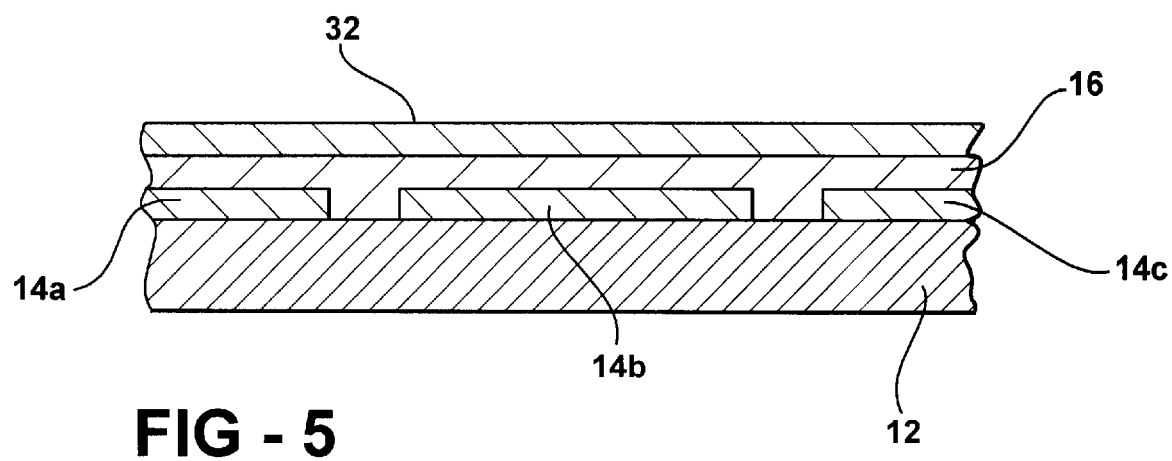

In a subsequent processing step, a body of photovoltaic material 16 is deposited onto the patterned series of bottom electrodes 14. As is shown in FIG. 5, the body of semiconductor material 16 comprises a single, monolithic body which covers all of the individual electrodes 14a–14c, as well as portions of the substrate exposed therebetween. This body of photovoltaic material 16 may be of various configurations, as discussed hereinabove with reference to FIGS. 1 and 2, and can be deposited by various techniques well known in the art.

In a next step of the invention, a layer of transparent, electrically conductive, top electrode material 32 is deposited on the photovoltaic body 16. This layer of top electrode material 32 has a thickness defined by the formula $$T = \frac{3\lambda}{4n}$$

wherein $\lambda$ is a wavelength of light in the range of 450–600 nm, and n is the index of refraction of the top electrode material. As previously discussed, this top electrode layer 32 establishes a three-quarter $\lambda$ anti-reflective condition.

Figure 6:
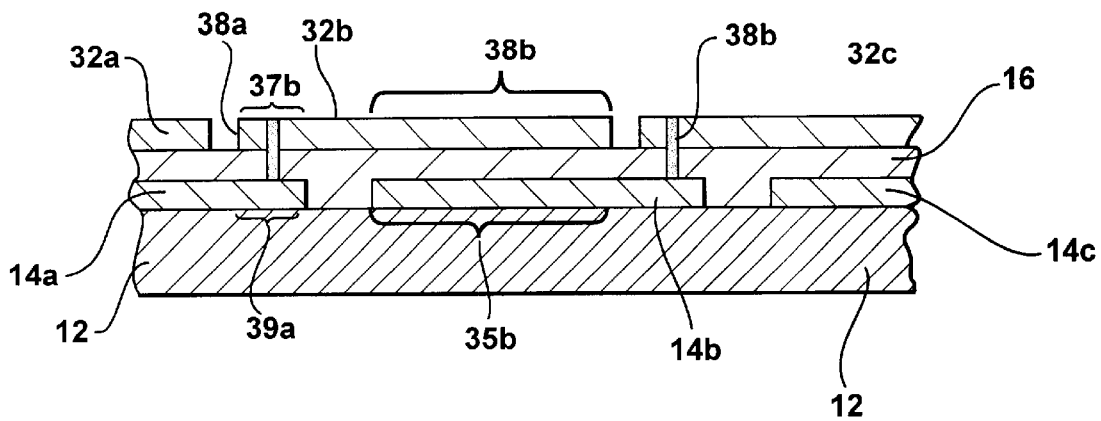

As shown in FIG. 6, the body of top electrode material 32 is scribed through to the semiconductor body 16, so as to define a plurality of spaced apart top electrodes 32a, 32b, 32c. The top electrode material may be patterned by a variety of techniques, such as laser patterning, chemical etching, abrasive patterning or water jet patterning. The top electrodes 32a–32c are disposed so that the major portion of each top electrode overlies a major portion of a corresponding bottom electrode, and so that a minor portion of each top electrode overlies a minor portion of an adjacent bottom electrode. For example, as is shown in FIG. 6, top electrode 32b includes a major portion 33b which overlies a major portion 35b of a corresponding bottom electrode 14b; and a minor portion 37b which overlies a minor portion 39a of an adjacent bottom electrode 14a.

As is further illustrated in FIG. 6, the module includes a number of high electrical conductivity shunts 38 formed therethrough so as to provide a high conductivity electrical path between the top electrode of one photovoltaic device of the module, and the bottom electrode of an adjoining device. For example, as is shown in FIG. 6, the shunt 38a establishes electrical communication between top electrode 32b and bottom electrode 14a, and shunt 38b establishes electrical communication between top electrode 32c and bottom electrode 14b. In this manner, there is provided an array of photovoltaic devices electrically interconnected in series.

In the FIG. 6 embodiment, the major portion 33b of top electrode 32b, the major portion 35b of bottom electrode 14b, and portions of the photovoltaic body 16 lying therebetween provide a photovoltaic device which is in series with an adjoining device similarly defined by top electrode 32c, bottom electrode 14c and the photovoltaic body 16 therebetween, with electrical communication being established by the high conductivity shunt path 38b. Within the context of this disclosure, a high conductivity shunt path is defined as a path having an electrical conductivity which is higher than the electrical conductivity of the photovoltaic body 16.

The high conductivity shunt paths are preferably formed by laser irradiation, and a YAG laser has been found to be one preferred source of irradiation. Other lasers such as excimer lasers may be similarly employed, as may be ion lasers and the like. While not wishing to be bound by speculation, the inventors hereof presume that the high conductivity path through the photovoltaic body 16 is caused by the heating effect of the laser which may induce crystallization and/or compositional change of the semiconductor body, which increases its conductivity. In those instances where the photovoltaic body is fabricated from amorphous or microcrystalline material, it is believed that laser irradiation induces crystallization which provides a high conductivity channel. It is also possible that some portions of the electrode material may interact with the semiconductor body during irradiation to produce the high conductivity channel. Duration and intensity of the laser pulse will depend upon the thickness of, and material forming, the photovoltaic body. In some instances, other sources of localized heating, such as a non-coherent beam of light, or a beam of particles such as electrons or protons, or a heated probe may be similarly employed.

Figure 7:
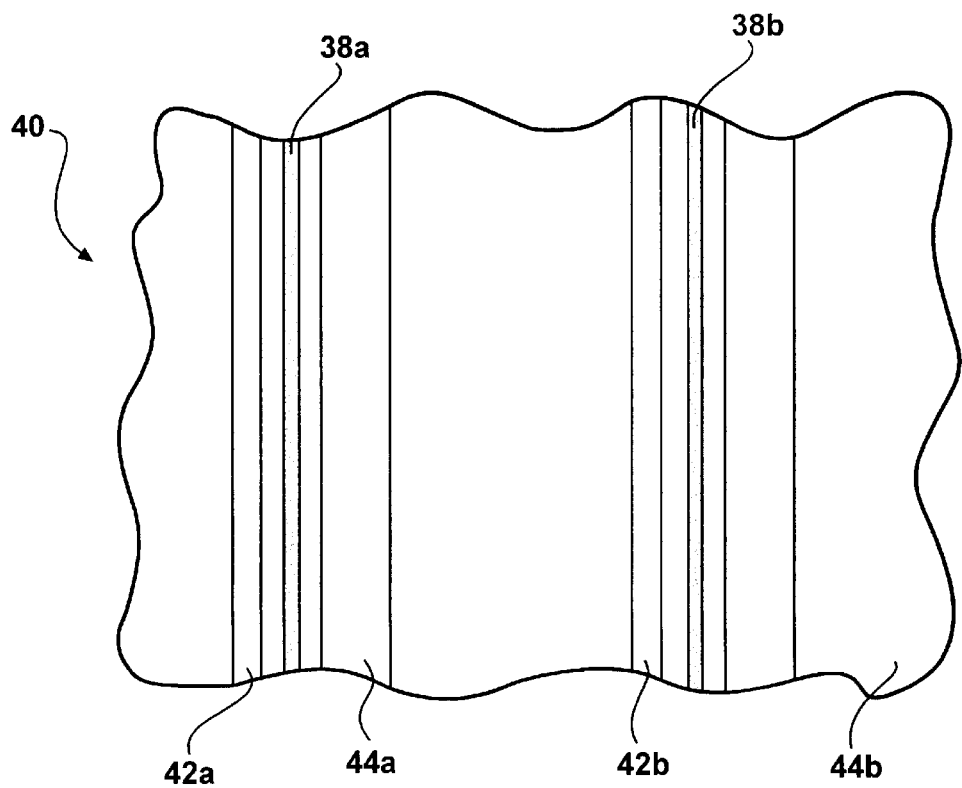
FIG. 7 is a top plan view of a portion of a module structured in accord with the principles of the present invention.

Referring now to FIG. 7, there is shown a top plan view of a portion of a photovoltaic module structured in accord with the principles of the present invention, and corresponding generally to the portion of the module illustrated in FIGS. 3–6. In the illustration of FIGS. 3–7, it is to be understood that the thicknesses of the various layers have been exaggerated for purposes of illustration. Likewise, the widths of the various channels defined through the layers have also been exaggerated for purposes of illustration. As shown in FIG. 7, a module 40 includes conductive channels 38a, 38b extending along the width thereof, together with channels 42a, 42b passing through the top electrodes thereof, and channels 44a, 44b passing through the bottom electrodes thereof. The module of FIG. 7 will include terminals for withdrawing photogenerated current therefrom, in accord with conventional design. The number and placement of the terminals will depend on module configuration. For example, a series connected module will have a first terminal associated with a top electrode of one device of the array, and a second terminal associated with a bottom electrode of a different device of the array.

In the module of FIG. 7, the photovoltaically active area of the module has a length $L_1$ which is approximately 1 centimeter, and the channels 42, 44 and shunt 38 have a collective length $L_2$ which is approximately 200 microns. It has been found that utilizing a three-quarter $\lambda$ top electrode, the photovoltaic current may be efficiently collected over a length of at least 1 centimeter. The FIG. 7 module 40 may be made in a width W which is limited only by processing and handling equipment, since the module design assures that photogenerated currents will not have had to travel more than 1 centimeter through the top electrode material, in any device. Thus, the devices of the present invention are characterized in that they are free of any opaque, current collecting structures in the photovoltaically area thereof, and insofar as the photovoltaically active area is configured to have its shortest linear dimension be at least 0.5 cm, and more preferably at least 1 cm. Such collection lengths could not be heretofore achieved utilizing one-quarter λ electrodes.

Yet other configurations of module, and other methods for their fabrication may be implemented in accord with the present invention. Referring now to FIGS. 8–12, there is shown yet another embodiment of the present invention. This embodiment is also directed to the fabrication of a photovoltaic module which comprises a plurality of photovoltaic devices electrically interconnected in series, and supported upon a substrate.

Figure 8:
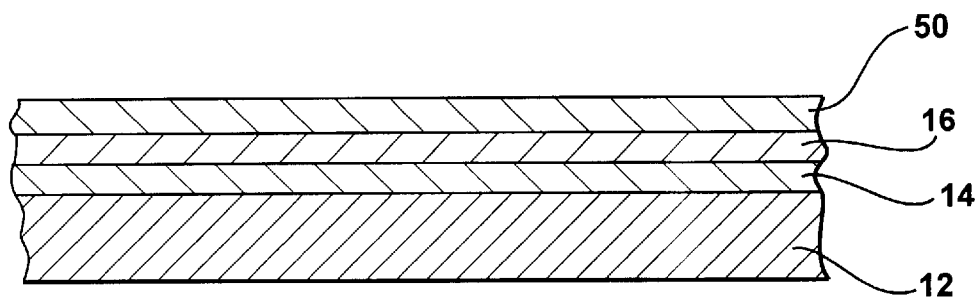
FIGS. 8–12 depict the sequential steps in the fabrication of a photovoltaic device in accord with another embodiment of the present invention.
Figure 9:
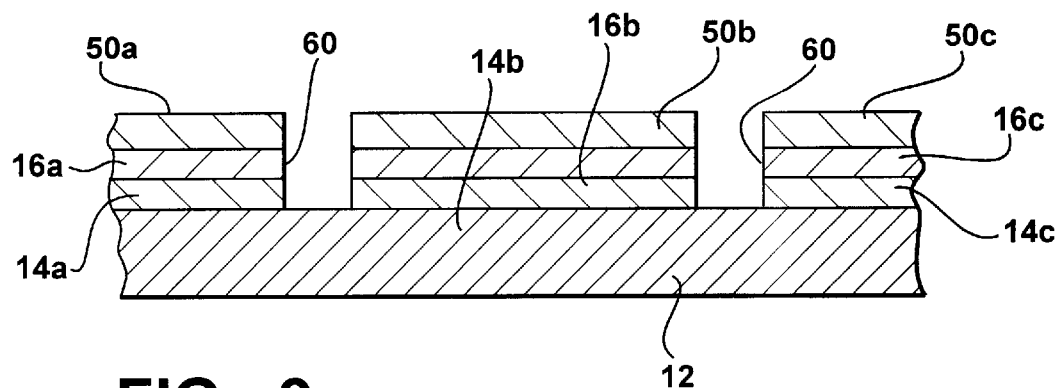
Figure 10:
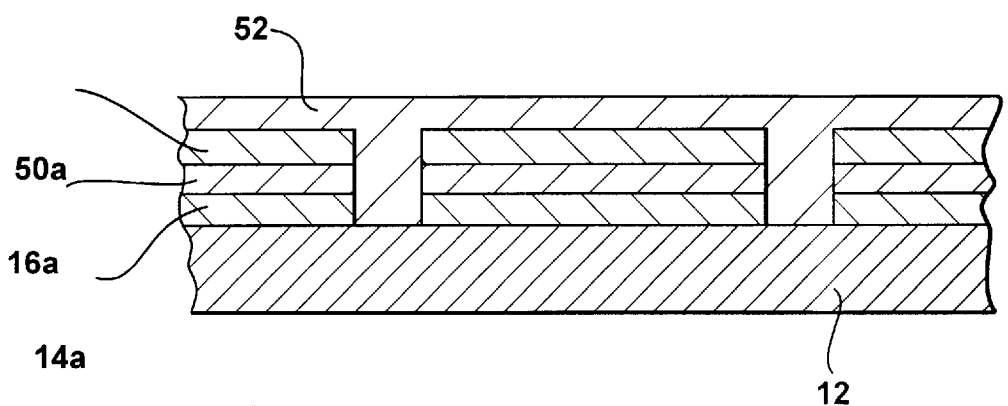

FIG. 8 shows a body of substrate material 12, generally similar to that described hereinabove, and having a layer of bottom electrode material 14 disposed thereupon, with a photovoltaic body 16 disposed thereatop. Also shown in the illustration of FIG. 8 is a layer of top electrode material 50, disposed upon the photovoltaic body 16. This layer of top electrode material 50 is a layer of transparent, conductive material as in the previous embodiment; however, it is notable that the thickness of this layer 50 is less than the three-quarter λ layers previously described, and in connection with this embodiment, this layer 50 will be referred to as the first sublayer of top electrode material.

In the next step of this embodiment, channels are formed through the first sublayer 50, the body of photovoltaic material 16, and through the layer of bottom electrode material 14 and extending to the substrate 12. These channels divide each of the layers into electrically isolated portions. After the channels have been formed, the edges of the layers 14, 16, 50 exposed in the channels are passivated so as to produce an electrically resistive surface 60 thereupon. This passivation preferably comprises formation of a layer of oxide, nitride or other such resistive material thereupon, and may be accomplished by wet chemical processing, treatment in an electrochemical cell, plasma reactions or the like. For example, exposed surfaces of a silicon semiconductor can be converted to silicon oxide or nitride, as can be exposed surfaces of a metal. The top electrode material is preferably formed from a metallic oxide, and such materials can be made highly resistive by nitriding. Also, in the illustrated embodiment, residual conductivity at the edges of the first sublayer 50 of top electrode material exposed in the channels, is not detrimental to function of the photovoltaic module.

In a next step of the process, a second sublayer of top electrode material 52 is deposited upon the device so as to cover the first sublayer 50 and fill the channels. The thickness of the second sublayer of top electrode material is selected so that the total thickness of the two sublayers will establish the three-quarter λ condition.

In a next step in the processing of the module of this embodiment, high conductivity shunts 38a, 38b are formed through the first sublayer of top electrode material 50, the second sublayer of top electrode material 52, and the photovoltaic body 16 so as to establish electrical communication with the bottom electrodes 14.

Figure 11:
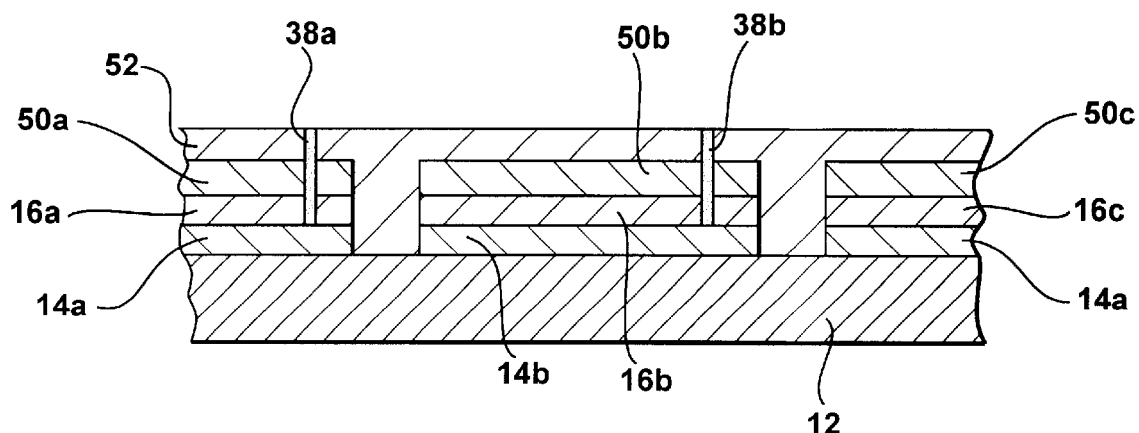
Figure 12:
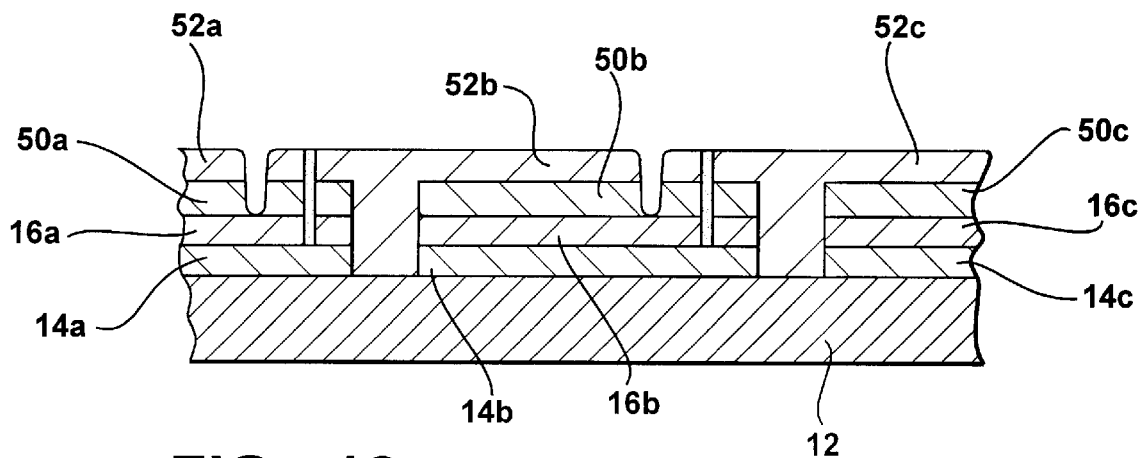

In a final step, channels are formed through the first, 50 and second, 52 sublayers. These channels extend through both of the sublayers, and stop at the semiconductor body 16. These channels isolate and segment the two sublayers 50, 52 of top electrode material, and together with the shunts 38, provide a series connected array of photovoltaic devices, as is shown in FIG. 12. These channels, like others in the modules, may be formed by any technique known in the art such as laser ablation, chemical etching, plasma etching, ion milling, abrasive removal of material, water jet techniques and the like. It should be noted that the various steps illustrated in the embodiment shown herein may be implemented in various orders. For example, the formation of the shunts, as is shown in FIG. 11, may be implemented either before or after the deposition of the second sublayer 52 of top electrode material. Likewise, the channels through the top electrode material may be formed either before, or after shunt formation. It should also be noted that the modules shown herein may further include top protective layers of silicon dioxide or organic polymers thereupon. Also, shunt formation may take place after a top protective coat is in place, particularly in those instances wherein the top protective coat is a relatively thin layer of silicon dioxide or the like.

The principles of the present invention are illustrated by an experimental series wherein photovoltaic devices having one-quarter λ and three-quarter λ top electrodes were prepared. The efficiencies of these devices were measured, and differences attributable to the top electrodes were noted. The data from this experimental series is summarized in Table 1 hereinbelow.

TABLD 1

| Device | 60 nm | 180 nm | % diff. | 60 nm/SiOx | 180 nm/SiOx | % diff. |
|---|---|---|---|---|---|---|
| Triple | 24.28 | 22.43 | 7.6 | 23.68 | 22.65 | 4.3 |
| Top | 8.38 | 7.73 | 7.8 | 8.10 | 7.75 | 3.2 |
| Middle | 8.40 | 7.93 | 5.6 | 8.21 | 7.95 | 3.2 |
| Bottom | 7.50 | 6.77 | 9.8 | 7.46 | 6.95 | 6.8 |
| Si:Ge | 24.14 | 22.56 | 6.5 | 23.57 | 22.62 | 4.0 |

One group of photovoltaic devices comprise triple tandem devices generally similar to those shown in FIG. 2, except that three separate triads of p-i-n configuration were included in the devices. The semiconductor alloy materials employed in the photovoltaic body comprised thin film alloys of hydrogenated silicon. At each instance, the top electrode was prepared from indium tin oxide having a resistivity of 50 ohm/□ when at a 60 nm thickness. Four separate devices of triple tandem configuration were prepared. The first had a top electrode which was 60 nm thick, and this corresponded to a one-quarter λ condition. The second had a top electrode which was 180 nm thick, which corresponded to a three-quarter λ condition. The third device included a 60 nm top electrode and was overcoated with 2 microns of silicon oxide. The fourth device had a 180 nm top electrode and was also coated with 2 microns of silicon oxide. The photovoltaic conversion efficiencies of the devices were measured in accord with conventional procedures. In addition, the efficiencies of the individual p-i-n triads of the devices were also measured. Table 1 summarizes the efficiencies and also tabulates the percent difference in the efficiencies. It will be seen from Table 1 that the three-quarter λ top electrode does decrease the overall efficiency of the device by several percent. It is notable that this effect is fairly small when the silicon dioxide overcoat is employed. In almost all instances, devices will be manufactured including such an overcoat, and as seen in Table 1, photovoltaic conversion efficiency of a triple device is approximately 4.3% lower when the thicker electrode is included.

Table 1 also summarizes the results of a second experimental series carried out with a p-i-n type photovoltaic device which included a hydrogenated silicon germanium alloy material in the intrinsic layer of the photovoltaic body. Again, four examples were prepared utilizing the one-quarter and three-quarter $\lambda$ coatings both with and without the silicon dioxide top coat. Efficiencies, and percent differences therein, are also summarized for this series in Table 1.

As illustrated by the experimental series of Table 1, inclusion of a three-quarter $\lambda$ top electrode in a photovoltaic device results in somewhat lowered photovoltaic efficiency which is attributable to the narrower range of the antireflective condition established by the thicker layer, and for this reason, conventional wisdom has heretofore directed the use of one-quarter $\lambda$ coatings in the manufacture of photovoltaic devices. The present invention breaks with conventional wisdom, and recognizes that the three-quarter $\lambda$ coating can confer some advantages in fabrication of photovoltaic devices, which advantages more than offset losses in efficiency resultant from a less than ideal anti-reflective condition.

Table 2 hereinbelow summarizes the results of calculations of module efficiency for a conventional gridded module, and a module of gridless design of the type depicted in FIG. 7.

TABLE 2

|  | Grid module | Gridless module |
|---|---|---|
| Electrical loss | 2.0 | 1.5 |
| Grid coverage or Excess reflection | 4.0 | 4.3 |
| Dead area | 4.5 | 2.9 |
| Total loss | 10.5 | 8.7 |

Electrical losses in the gridless module are slightly lower than in the gridded module, because of the higher electrical conductivity of the thicker top electrode layer. Losses in the gridless module resultant from excess reflection are higher than reflective losses in the conventional gridded module with the one-quarter $\lambda$ coating; however, photovoltaically inactive dead areas of the gridless module are significantly lower than are nonproductive areas in the gridded module. As a result, the overall losses in the gridless module are significantly lower than the losses in the conventional gridded module. Hence, use of the three-quarter $\lambda$ layer of the present invention allows for the manufacture of a photovoltaic device having an overall increase in its efficiency. In addition, elimination of the gridding step simplifies device design and fabrication, and eliminates possible sources of failure.

Thus, it will be appreciated that the present invention represents a break with heretofore conventional wisdom, and provides an unexpected enhancement in device efficiency and reliability, and simplifies and economizes device fabrication.

While this invention has primarily been described in combination with the fabrication of large area modules of series connected, thin film photovoltaic devices, the principles hereof are equally applicable to individual cells, parallel connected, and mixed series/parallel arrays, as well as to devices and arrays fabricated from crystalline semiconductor materials and the like.

In view thereof, it is to be understood that the foregoing drawings, discussion, description and examples are illustrative of particular embodiments of the present invention, but are not meant to be limitations upon the practice thereof. It is the following claims, including all equivalents, which define the scope of the invention.

What is claimed is:

1. A method for fabricating a photovoltaic module having an enhanced absorption of light of a wavelength $\lambda$, said method comprising:

providing an electrically insulating substrate;

disposing a layer of electrically conductive, bottom electrode material on said substrate;

removing selected portions of said bottom electrode material so as to define a plurality of spaced apart bottom electrodes which are electrically isolated from one another;

depositing a body of photovoltaic material onto said substrate so as to cover said plurality of bottom electrodes;

selecting a wavelength of light $\lambda$ at which the absorption of light, by said photovoltaic module, is to be enhanced;

calculating the thickness T of a layer of transparent, electrically conductive top electrode material which is to be deposited upon said body of photovoltaic material according to the formula:

$$T = \frac{3\lambda}{4n},$$

wherein $\lambda$ is said selected wavelength of light, and n is the index of refraction of said top electrode material at $\lambda$;

depositing said layer of transparent, electrically conductive top electrode material, having said thickness T, upon said body of photovoltaic material; whereby said layer of transparent, electrically conductive top electrode material establishes an anti-reflective condition for said wavelength of light $\lambda$ thereby enhancing the absorption of said wavelength of light by said body of photovoltaic material;

removing portions of said layer of top electrode material so as to define a plurality of spaced apart top electrodes, each top electrode having a major portion which overlies a corresponding bottom electrode, and is spaced apart therefrom by said body of photovoltaic material, and each top electrode further including a minor portion which overlies a minor portion of an adjacent bottom electrode, and is spaced apart therefrom by said body of photovoltaic material;

forming a plurality of electrically conductive shunts through said body of photovoltaic material, each of said shunts having higher electrical conductivity than does said body of photovoltaic material, each shunt establishing electrical communication between the minor portion of a respective one of said top electrodes, and the minor portion of an adjacent bottom electrode whereby a series electrical communication is established between a plurality of photovoltaic cells.

2. The method of claim 1, further characterized in that the method does not include any step of disposing any current collecting grid upon any of said plurality of spaced apart top electrodes.

3. The method as in claim 1, wherein the shortest dimension of the major portion of each of said top electrodes is at least 0.5 cm.

4. The method of claim 1 wherein the surface area of the major portion of each of said top electrodes is at least 1cm$^2$.

5. The method of claim 1, including the further step of disposing an electrically insulating, transparent, protective top coat upon said module so as to cover the top electrodes thereof.

6. A method for fabricating a photovoltaic module, having an enhanced absorption of light of a wavelength λ, said method comprising:

providing an electrically insulating substrate;

disposing a layer of electrically conductive, bottom electrode material upon said substrate;

disposing a photovoltaic body on said layer of bottom electrode material;

disposing a first layer of electrically conductive, transparent, top electrode material upon said photovoltaic body, said first layer of top electrode material having a first thickness $T_1$;

scribing through said first layer of top electrode material, said photovoltaic body and said layer of bottom electrode material so as to define a plurality of electrically isolated regions, each region comprised of a portion of said layer of back electrode material, a portion of said photovoltaic body, and a portion of said first layer of top electrode material;

passivating the sides of each of said regions so as to form a layer of electrically insulating material thereupon;

depositing a second layer of top electrode material upon said first layer of top electrode material, said second layer of top electrode material establishing electrical communication between said regions, said second layer of top electrode material having a second thickness $T_2$ such that $T_1+T_2$ equals $$T = \frac{3\lambda}{4n},$$

wherein λ is a wavelength of light in the range of 450 to 600 nm, and n is the index of refraction of said top electrode material at λ;

forming an electrically conductive channel through the photovoltaic body in each of said regions, the channels having an electrical conductivity higher than the electrical conductivity of said photovoltaic body, the channels establishing electrical communication between the back electrode material, and the top electrode material in each of said regions;

forming an isolation channel in each of the regions, each isolation channel passing through the entirety of the first and the second layer of top electrode material in each region, and each isolation channel being disposed in board of the conductive channel in each region; whereby there are provided a plurality of photovoltaic cells which are electrically interconnected in a series relationship.

7. A method for fabricating a photovoltaic device having an enhanced absorption of light of a wavelength λ, said method comprising:

providing a substrate electrode;

disposing a photovoltaic body upon the substrate electrode, in electrical communication therewith;

selecting a wavelength of light λ at which the absorption of light, by said photovoltaic device, is to be enhanced;

calculating the thickness T of a layer of transparent, electrically conductive top electrode material which is to be deposited upon said photovoltaic body, according to the formula:

$$T = \frac{3\lambda}{4n},$$

wherein λ is said selected wavelength of light, and n is the index of refraction of said top electrode material at λ;

depositing said layer of transparent, electrically conductive top electrode material, having said thickness T, upon said photovoltaic body; whereby said layer of electrically conductive, top electrode material establishes an anti-reflective condition for said wavelength of light λ, thereby enhancing the absorption of said wavelength of light by said photovoltaic body.

* * * * *